US007656743B2

(12) United States Patent
Srinivas et al.

(10) Patent No.: US 7,656,743 B2
(45) Date of Patent: Feb. 2, 2010

(54) CLOCK SIGNAL GENERATION TECHNIQUES FOR MEMORIES THAT DO NOT GENERATE A STROBE

(75) Inventors: Vaishnav Srinivas, San Diego, CA (US); Sanat Kapoor, San Diego, CA (US); Srinivas Maddali, San Diego, CA (US); Vivek Mohan, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 71 days.

(21) Appl. No.: 11/364,296

(22) Filed: Feb. 28, 2006

(65) Prior Publication Data

US 2007/0104015 A1 May 10, 2007

Related U.S. Application Data

(60) Provisional application No. 60/735,421, filed on Nov. 10, 2005.

(51) Int. Cl.
*G11C 8/00* (2006.01)

(52) U.S. Cl. ............................. 365/233.1; 365/233.11; 365/233.12; 365/233.17

(58) Field of Classification Search ............. 365/233.1, 365/233.11, 233.12, 233.17, 233.16
See application file for complete search history.

(56) References Cited

U.S. PATENT DOCUMENTS 3,735,277 A * 5/1973 Wanlass ...................... 331/45
4,835,403 A * 5/1989 Wisniewski ............. 250/559.4
4,959,557 A * 9/1990 Miller ........................ 327/175
5,479,647 A 12/1995 Harness et al.
6,064,248 A * 5/2000 Seki .......................... 327/296
6,127,865 A * 10/2000 Jefferson .................... 327/149
6,130,550 A * 10/2000 Zaliznyak et al. ............ 326/39
6,466,491 B2 10/2002 Yanagawa
6,760,261 B2 7/2004 Partsch et al.
2002/0169524 A1* 11/2002 Nakamoto et al. ............ 701/1
2005/0088244 A1* 4/2005 Boerstler et al. .......... 331/36 C
2006/0273829 A1* 12/2006 Jorgenson et al. ........... 327/100
2007/0090887 A1* 4/2007 Seefeldt et al. ............... 331/17

FOREIGN PATENT DOCUMENTS

EP 0 525 221 B1 12/1995

OTHER PUBLICATIONS

International Search Report, PCT/US2006/060797 - International Search Authority - European Patent Office, May 3, 2007.
Written Opinion, PCT/US2006/060797 - International Search Authority - European Patent Office, May 3, 2007.

* cited by examiner

*Primary Examiner*—Thong Q Le
(74) *Attorney, Agent, or Firm*—Kenyon Jenckes; Ramin Mobarhan

(57) ABSTRACT

This disclosure describes a clock circuit for a memory controller. The described circuit uses a processor clock signal to generate an input clock signal for use during write operations to the memory, or to generate a feedback clock signal for use during read operations from the memory. The circuit is particularly applicable to mobile wireless devices that include memories that do not generate a strobe. The clock circuit may comprise a driver in series with a resistor element that generates an input clock signal for input to a memory, and a resistor-capacitor (RC) filter in series with a receiver that generates a feedback clock signal for output from the memory, wherein an input to the RC filter is tapped between the driver and the resistor element.

34 Claims, 4 Drawing Sheets

CLOCK SIGNAL GENERATION TECHNIQUES FOR MEMORIES THAT DO NOT GENERATE A STROBE

This application claims the benefit of U.S. Provisional Application No. 60/735,421, filed Nov. 10, 2005.

TECHNICAL FIELD

This disclosure relates to electronic memory and, more particularly, to clock signal generation techniques performed by a memory controller.

BACKGROUND

In computer environments, digital memory is used to store data. In some cases, a variety of different processors may have access to the same memory. For example, the different processors may be coupled to a shared memory via a system bus. Only one of the processors is able to access the memory at a given time via the system bus. A bus controller arbitrates the access to the bus and routes traffic accordingly.

In this disclosure, the term "processor" generally refers to any device that can access a memory, e.g., to either store data to the memory or retrieve data from the memory. Examples of processors include general purpose microprocessors, application specific processors such as application specific integrated circuits (ASICs), modulator-demodulators (MODEMs), central processing units, digital signal processors (DSPs), field programmable gate arrays (FPGAs), or any device that can process data from a memory. Accordingly, as used in this disclosure, the term "processor" broadly refers to any device, module or unit that can write data to the memory or retrieve data from the memory.

In order to access the memory, a clock signal is needed. A clock signal is generally a signal that switches with every cycle of a system clock in order to provide synchronization between different units or processors of the system. When data is written from a processor to a memory, the processor typically sends its clock signal to the memory controller, which uses the clock signal to synchronize the memory to the processor as data is written to the memory. When data is retrieved from the memory to a processor, however, clock signal generation can be more challenging.

Some memory devices provide a clock signal from the memory to the processor on an external line. Clock signals sent from a memory on an external line are often referred to as a "strobe." Unfortunately, memories that generate a strobe are more complex than memories that use the clock signal from the processor when retrieving data from the memory to the processor.

When the clock signal of a processor is used by the memory controller during data retrieval from the memory, delay becomes a paramount concern. In this case, the flight time of an incoming memory access signal, the access time to the memory, and the flight time of data sent from the memory to the memory controller can all add delay, which can undermine the accuracy of the clock signal. If the data is not properly clocked, errors may occur when reading data from memory.

Typically, the memory controller "re-clocks" the data in an attempt to account for the delay introduced by flight time and access time in order to ensure that the data is properly clocked. However, accurate re-clocking of data is difficult, and variations between processors, flight times, external factors (such as temperature variation), and other variables can compound these difficulties.

SUMMARY

In general, this disclosure describes a clock circuit for a memory controller. The described circuit uses a processor clock signal to generate an input clock signal for use during write operations to the memory, or to generate a feedback clock signal for use during read operations from the memory. In this manner, the circuit provides a clocking solution applicable to memories that do not generate a strobe, i.e., strobeless memories. The circuit also facilitates the use of a single line between the memory and the memory controller for clocking purposes. The described circuit and techniques may be especially useful for wireless mobile applications.

In one embodiment, this disclosure describes a clock circuit for a memory controller. The clock circuit comprises a driver in series with a resistor element that generates an input clock signal for input to a memory, and a resistor-capacitor (RC) filter in series with a receiver that generates a feedback clock signal for output from the memory, wherein an input to the RC filter is tapped between the driver and the resistor element.

In another embodiment, this disclosure describes a system comprising a memory, and a memory controller to control access to the memory. The memory controller comprises a clock circuit including a driver in series with a resistor element that generates an input clock signal for input to the memory, and an RC filter in series with a receiver that generates a feedback clock signal for output from the memory, wherein an input to the RC filter is tapped between the driver and the resistor element.

In another embodiment, this disclosure describes a method comprising generating an input clock signal for input to a memory by passing a processor clock signal from a processor through a driver and a resistor element of a clock signal circuit, and generating a feedback clock signal for output from the memory by passing an input through an RC filter and a receiver of the clock signal circuit, wherein the input to the RC filter is tapped between the driver and the resistor element of the clock signal circuit.

The details of one or more embodiments of this disclosure are set forth in the accompanying drawings and the description below. Other features, objects, and advantages will be apparent from the description and drawings, and from the claims.

DETAILED DESCRIPTION

Figure 1:
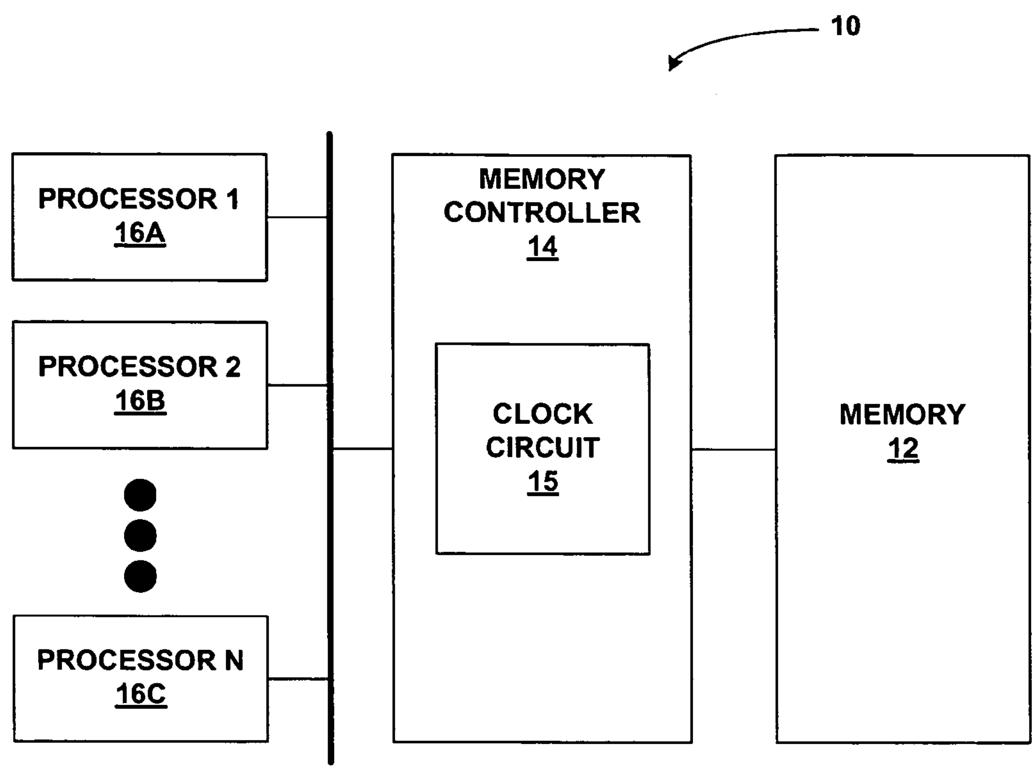
FIG. 1 is a block diagram illustrating a system according to an embodiment of this disclosure.

FIG. 1 is a block diagram illustrating a system 10 according to an embodiment of this disclosure. As shown in FIG. 1, system 10 includes a memory 12 and a memory controller 14 that controls access to memory 12. A plurality of processors 16A-16C (collectively processors 16) are coupled to memory controller 14 via a system bus 18. In this manner, processors 16 share memory 12. For example, only one of processors 16 is able to access memory 12 at a given time via system bus 18.

A bus controller (not shown) arbitrates access to system bus, and routes traffic accordingly. Accordingly, any one of processors 16 can gain access to memory 12.

As noted above, the term "processor," as defined in this disclosure, refers to any device that can access a memory to either store data to the memory or retrieve data from the memory. Examples of processors 16 include general purpose microprocessors, application specific processors such as application specific integrated circuits (ASICs), modulator-demodulators (MODEMs), central processing units, digital signal processors (DSPs), field programmable gate arrays (FPGAs), or any device that can process data from a memory. Typically, each of processors 16 comprise a different type of processor relative to other ones of processor 16. For example, processor 16A may comprise a DSP, while processor 16B may comprise a MODEM. A DSP and MODEM, for example, may be used together in a variety of devices to which this disclosure is useful, such as mobile wireless communication devices and radiotelephones. System 10 may include at least two processors that can access memory 12, although any number of processors may be used.

Memory controller 14 comprises a clock circuit 15 that uses a processor clock signal from one of processors 16 to generate an input clock signal and a feedback clock signal. The input clock signal is used during write operations to memory 12, while the feedback clock signal is used during read operations from memory 12. Clock circuit 15 uses a respective processor clock signal from a given one of processors 16 that is accessing memory 12 in order to generate either an input or a feedback clock signal. The described clock circuit 15 facilitates the use of a single line between memory 12 and memory controller 14 for clocking purposes, yet generates both input clock signals for input to memory 12 and feedback clock signals for output from memory 12. If a different one of processors 16 accesses memory 12, its respective processor clock signal is used by clock circuit 15 to generate the input and feedback clock signals. In exemplary embodiments, each one of processors 16 generates its own processor clock signal, and these processor clock signals are used as input to the clock circuit 15 for each respective processor.

Memory 12 may comprise a memory device that does not generate a strobe. Thus, when reading data from memory 12, a clock signal must be generated to synchronize the data being read to the clock of the given processor reading the data from memory 12. Examples of memory devices that do not generate a strobe include pseudo static random access memory (PSRAM), burst memory, NOR FLASH memory, synchronous dynamic random access memory (SDRAM), and single date rate SDRAM (SDR-SDRAM).

Figure 2:
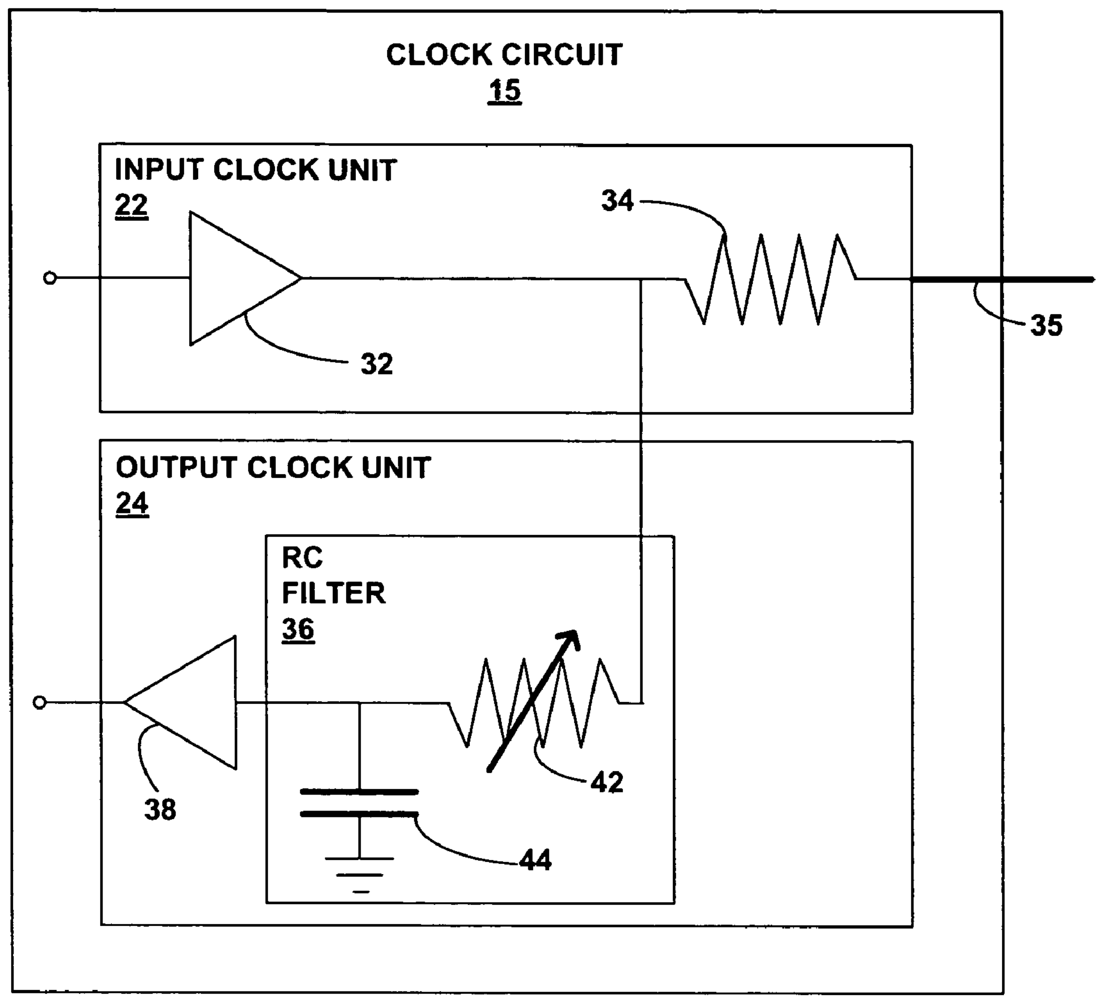
FIG. 2 is a circuit diagram illustrating a clock circuit according to an embodiment of this disclosure.

FIG. 2 is a circuit diagram illustrating a clock circuit 15 according to an embodiment of this disclosure. Clock circuit 15 will be described in the context of its use in system 10 of FIG. 1, although clock circuit 15 could also be used in other types of systems. As shown in FIG. 2, clock circuit 15 includes an input unit 22 and an output unit 24. Input unit 22 generates the input clock signal for writes operations to memory 12, while output unit 24 generates the feedback clock signal for read operations from memory 12. In this manner, output unit 24 permits the clock signal input provided by a given one of processors 16 to be used for both read and write operations. In particular, output unit 24 provides a feedback clock signal to the processor for use in read operations. Input unit 22 and output unit 24 are labeled to aid in the understanding of clock circuit 15, although these components may be integrated in the implementation of clock circuit 15.

Clock circuit 15 includes a driver 32 in series with a resistor element 34, such as an on-die termination (ODT) resistor. Resistor element 34 may define a resistance of approximately 25 Ohms, although other resistances may be defined for other embodiments. The input to driver 32 is a processor clock signal from a given one of processors 16 currently accessing memory 12 via system bus 18. The output of resister element 34 comprises an input clock signal for input to the memory. Thus, when a given one of processors 16 writes data to memory 12, the output of resister element 34 comprises the input clock signal used by memory controller 14 to synchronize the write operation from one of processors 16.

In accordance with this disclosure, the output of resister element 34 is sent to memory 12 via a line 35 between memory controller 14 and memory 12. Clock circuit 15 allows line 35 to be the only clock signal line between memory controller 14 and memory 12, thereby avoiding the need for separate lines for the input and feedback clock signals.

Clock circuit 15 also includes an RC filter 36 in series with a receiver 38. The output of receiver 38 comprises a feedback clock signal for output from the memory. Thus, when a given one of processors 16 reads data from memory 12, the output of receiver 38 comprises the clock signal used by memory controller 14 to synchronize the read operation to one of processors 16. RC filter 36 may comprise a programmable RC filter, although this disclosure is not necessarily limited in this respect.

Importantly, the input to RC filter 36 is tapped between driver 32 and resistor element 34 of input unit 22. By defining the input to RC filter 36 prior to resistor element 34, the voltage of this input to RC filter 36 is increased relative to the voltage on line 35. This can help ensure that receiver 38 will not be accidentally tripped. In other words, by defining the input to RC filter 36 prior to resistor element 34, the chance of accidental and undesirable activation of receiver 38 can be reduced. The receiver 38 may be tripped, for example, when an input voltage to receiver 38 crosses its voltage threshold.

For example, if $V_{DD}$ defines the supply voltage of driver 32, and receiver 38 is programmed to trip at $\frac{1}{2}V_{DD}$, receiver 38 could be accidentally tripped if the input to RC filter 36 were taken from line 35. In order to avoid this undesirable activation of receiver 38, the input to RC filter 36 is taken prior to resistor element 34, i.e., between driver 32 and resistor element 34. By way of example, driver 32 may comprise a 25 Ohm driver, and resistor element 34 may comprise a 25 Ohm ODT resistor. Receiver 38 may comprise a high impedance receiver that provides a capacitive load and not a resistive load.

RC filter 36 may comprise any type of RC filter and may be programmable or non-programmable. In one example RC filter 36 comprises a programmable filter that includes a programmable resistor 42 in parallel with a capacitor 44. Moreover, in some cases, parasitic capacitance may be sufficient to create a suitable RC filter, in which case, capacitor 44 consists of parasitic capacitance. In this case, implementation is simplified insofar as an additional capacitor element can be eliminated while still realizing an RC filter. The parasitic capacitance, for example, may be generated by gates of field effect transistors (FETs) in receiver 38, diodes or any components that provide electro static discharge (ESD). Metal routing may also contribute a small amount of capacitance.

The primary purpose of RC filter 36 is to isolate receiver 38 from any non-monotonic ringing or reflections in the signals. Programmability in the resistance and/or capacitance of RC filter 36 may also be provided to allow for adjustments to the level of isolation and dampening that is needed. In this case, RC filter 36 may be programmed based on the actual parameters in system 10. In addition, programmability also provides a useful means of adjusting the delay. In other words, the ability to adjust the delay, via programmability, can be a useful by-product of RC filter, while the main purpose may be to isolate receiver 38 from any non-monotonic ringing or reflections in the signals.

If memory controller 14 is a mobile memory interface, then the amount of resistance and capacitance needed by RC filter 36 to achieve acceptable dampening/isolation would be conveniently related to the data rates of memory 12. Thus, if the data rate is too fast, then adding RC filter 36 could make the path incapable of passing such a data rate. In this case, the dampening could not be achieved without the expense of performance. The needed dampening is related generally to the length of the line from a given one of processors 16 to memory 12. In the case of mobile interfaces, this distance is typically short enough and the data rate slow enough to allow the scheme described herein. By way of example, in mobile applications the distance from a given one of processors 16 to memory 12 may be between approximately 0.5 and 2.5 inches (between approximately 1.27 and 6.35 centimeters). The date rate in mobile applications may be between approximately 50-133 Megahertz. The circuit may also work at even slower rates, but the circuit may be difficult to implement at rates above 150 Megahertz. Therefore, this disclosure specifically contemplates the circuit being most useful in mobile applications with data rates of memory 12 less than approximately 150 Megahertz.

Figure 3:
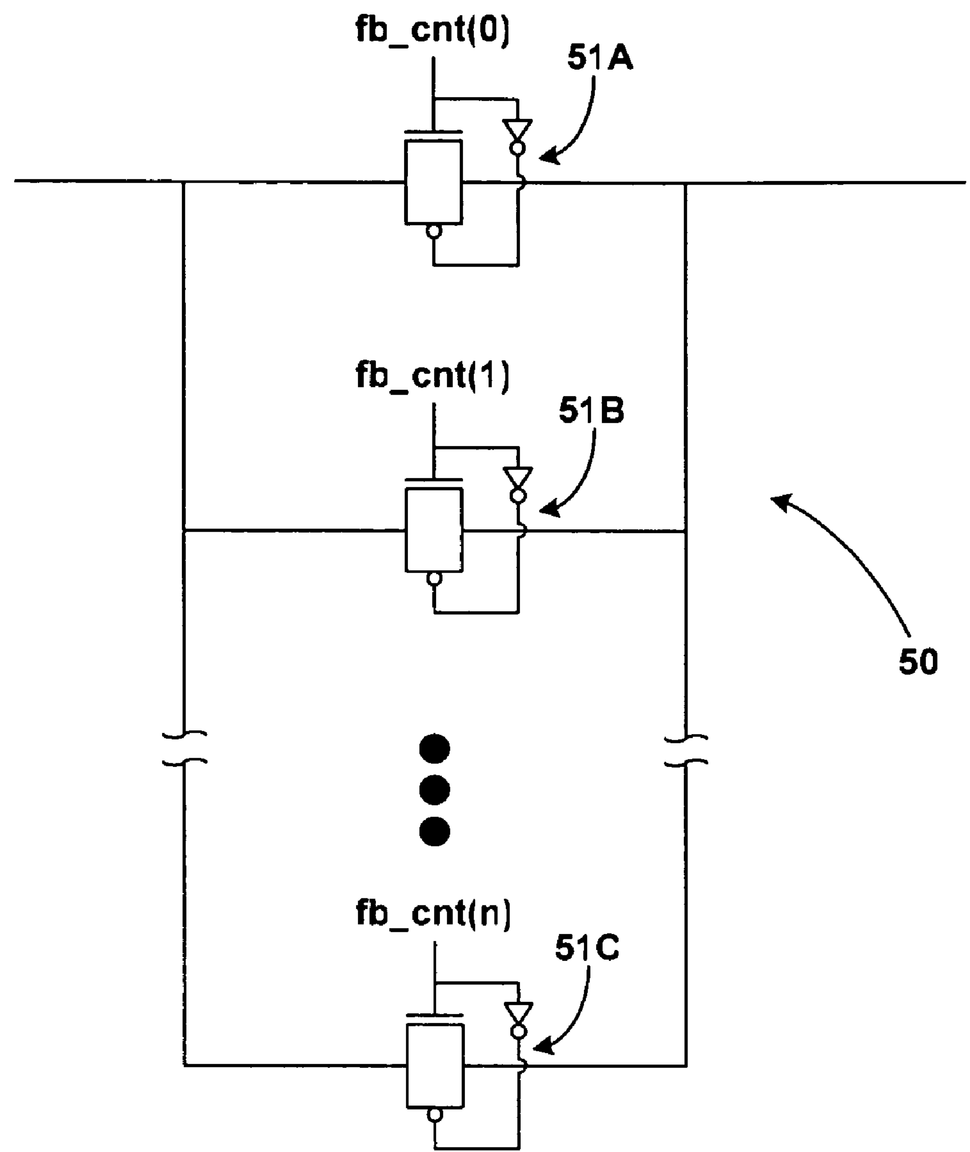
FIG. 3 is a circuit diagram illustrating one embodiment of a programmable resistor, which may be used in a clock circuit according to this disclosure.

It should be noted that while FIG. 2 illustrates a programmable RC filter 36, programmability in the resistance may not be necessary in some cases. Therefore a fixed resistance may suffice, and in this case transistors (such as shown in FIG. 3) would not be needed to realize the resistance. Instead, circuit 15 could use a multitude of on-chip methods to realize the resistance, such as poly resistors or diffusion resistors. Also, in other cases programmable capacitance could also be used.

In the illustrated example of FIG. 2, programmable resistor 42 may comprise a set of transistors in parallel. The transistors may comprise metal oxide semiconductor (MOS) transistors, and a programmable value can be used to determine the number of the transistors used to define resistance in programmable resistor 42 for delay purposes. For example, the transistors may comprise complimentary metal oxide semiconductor (CMOS) transistors arranged in parallel, wherein the programmable value defines how many of the transistors are "on" and how many are "off." The programmable value can be selected by a vendor of designer of memory controller 14 to tune RC filter 36 of clock circuit 15, in order to introduce the proper amount of delay for output clock signals. In this case, RC filter 36 comprises a programmable RC filter in which a desired amount of delay can be programmed by selection of the number of transistors used to define resistance in programmable resistor 42.

Of course, other types of programmable filters may also be used in a manner consistent with the teaching of this disclosure. In other words, in alternative embodiments, RC filter 36 may comprise a different type of RC filter to isolate receiver 38 from any non-monotonic ringing or reflections in the signals and to introduce the delay needed for effective re-clocking to define the output clock signal. Moreover, capacitor 44 could also be defined by a set programmable capacitors, in which case a desired amount of delay could be programmed (or affected) by selection of the desired level of capacitance in RC filter 36. As noted above, however, the implementation of RC filter 36 can be simplified by relying on parasitic capacitance for capacitor 44, and a programmably selectable set of MOS transistors in parallel for resistor 42.

By way of example, the resistance of resistor 42 may be in a range of approximately 500 Ohms to 10 Kilo-Ohms. Depending on the resistance in resistor 42, the capacitance of capacitor 44 may by in a range of approximately 100 femtofarad (fF) to 1 petafarad (pF). These ranges of values, however, are approximates and the actual values of resistance and capacitance in RC filter 36 may vary in other embodiments.

Clock circuit 15 may provide a simplified clocking solution relative to other solutions used for memories that do not generate a strobe. For example, the implementation of clock circuit 15 shown in FIG. 2 may be simpler and draw substantially less power than delay lock loop (DLL) techniques commonly used for personal computer environments. Clock circuit 15 may also be simpler and draw substantially less power than DLL techniques used in mobile applications, in which the DLL periodically switches to a sleep mode for power conservation.

Clock circuit 15 is also very useful insofar as it is sensitive to delay changes, e.g., as a result of external factors such as temperature. The circuit may also automatically compensate any changes in the loads, as the circuit may be load sensitive. Clock circuit 15 may be more sensitive to delays than other techniques, since delays are often not tracked by on-chip programmable delay cells. Clock circuit 15 can also be sensitive to the load and variations within the input and output of circuit 15.

Clock circuit 15 may be specifically responsive to input/output delays, such as delay through the output path in the driver and the input path in the receiver. The importance of this is that on-chip circuits/programmable delays do not track I/O circuits well. Also, a major portion of the delay in a clock circuit can vary over process, voltage and temperature variations. Fortunately, clock circuit 15 tracks the delays the clock going to memory 12 and the data coming back from memory 12. The delay through the output path in the driver 32 is seen by the clock going to the memory, and clock circuit 15 automatically tracks the same path before it is fed back to receiver 38. The delay through the input path in the receiver 38 is seen by the data coming back from the memory, and clock circuit 15 tracks when the feedback path loops through the same.

One potential disadvantage of using a common line to the memory for both the input and output clocking circuit is that the line that generates the input and output clock signals may become reflection sensitive. In this case, reflections from the input path may cause undesirable tripping of a receiver in the output path. However, this issue can be addressed by filtering the input to circuit 15 to be monotonic and insensitive to ringing in the reflection. Also, resistor element 34 can isolate the input path from any reflections near $V_{DD}/2$, which may be the tripping voltage of receiver 38, as described above. Thus, by tapping the input to the output clock circuit prior to resistor element 34, reflections near $V_{DD}/2$ can be shielded from receiver 38. If desired, an input filter (not shown) to circuit 15 may also be used to achieve any necessary dampening, which may depend on the length of the of the lines through circuit 15 and the output impedance of driver 32.

FIG. 3 is a circuit diagram illustrating one embodiment of a programmable resistor 50, which may correspond to programmable resistor 42 of FIG. 2. In this case, resistor 50 includes a plurality of MOS transistors 51A-51C in parallel. Transistors 51A-51C are referred to collectively as transistors 51. Control signals (labeled fb_cnt(0), fb_cnt(1) and fb_cnt(n)) define whether each respective one of transistors is on or off. The "fb_cnt" control signals stand for "feed-back count," and can provide increments of delay if resistor 50 is used in an RC filter. A programmable value defines the respective "fb_cnt" signals to define which ones of transistors 51 are on and which ones are off. This selection, defined by the programmable value, may define the resistance of resistor 50, and thus (referring again to FIG. 2), may define the delay provided by RC filter 36. A vendor, programmer, designer, or the like, of memory controller 14 may select the programmable value to define the desired amount of delay for the feedback clock signal relative to the processor clock input.

Figure 4:
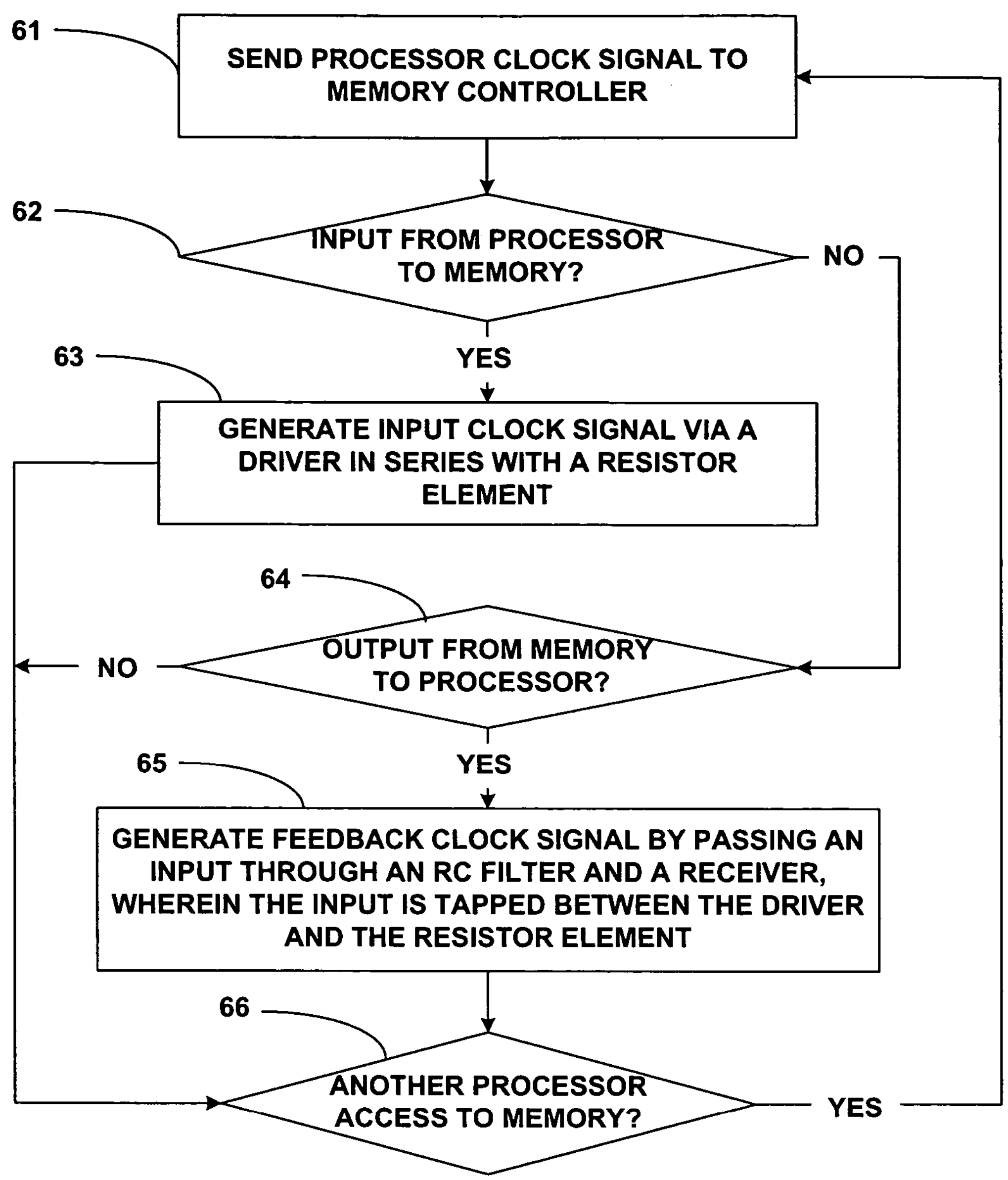
FIG. 4 is a flowchart illustrating a clock signal generation technique according to this disclosure.

FIG. 4 is a flowchart illustrating a clock signal generation technique according to this disclosure. As shown in FIG. 4, one of processors 16 sends its respective processor clock signal to memory controller 14 (61). If the processor is inputting data into memory 12 (yes branch of 62), clock circuit 15 generates an input clock signal via a driver 32 in series with a resistor element 34 (63). In this case, the input clock signal is provided to memory 12 via line 35.

On the other hand, if data is being output from memory 12 to the respective processor (yes branch of 64), then clock circuit 15 generates a feedback clock signal (65). In particular, clock circuit 15 generates the feedback clock signal by passing an input through programmable RC filter 36 and receiver 38, wherein the input to programmable RC filter 36 is tapped between driver 32 and resistor element 34 (65). The process may repeat any time a given one of processors 16 writes data to memory 12 or reads data from memory 12. However, if another one of processors 16 access memory 12 (yes branch of 66), the process repeats using that respective processor's clock signal as the input to memory controller 14 (61).

Various embodiments of the invention have been described. In particular, a clock circuit has been described for use in a memory controller. The described clock circuit provides a comprehensive clocking solution for reads and writes to memory that does not generate a strobe. In addition, the described clock circuit provides several other advantages, including low complexity implementation, the use of a single line between the memory and memory controller for clocking purposes, and the avoidance of unintentional tripping of the receiver.

Nevertheless, the described circuit may be used in other contexts. In other words, system 10 of FIG. 1 is only one exemplary environment in which clock circuit 15 may be used. Also, clock circuit 15 could use other types of programmable filters or a non-programmable RC filter in accordance with this disclosure. These and other embodiments are within the scope of the following claims.

The invention claimed is:

1. A clock circuit for a memory controller, the clock circuit comprising:

a driver in series with a resistor element that generates an input clock signal for input to a memory, the driver selectively separately couplable to a first processor clock and a second processor clock; and a resistor-capacitor (RC) filter in series with a receiver that generates a feedback clock signal for data output from the memory, wherein an input to the RC filter is tapped between the driver and the resistor element and the RC filter adjustable to the first processor clock to generate the feedback clock signal of a memory read operation of the first processor and to the second processor clock to generate the feedback clock signal of a memory read operation of the second processor.

2. The clock circuit of claim 1, wherein the resistor element comprises an on-die termination (ODT) resistor.

3. The clock circuit of claim 1, wherein the RC filter comprises a programmable RC filter.

4. The clock circuit of claim 3, wherein the programmable RC filter comprises a programmable resistor in parallel with a capacitor.

5. The clock circuit of claim 4, wherein the capacitor consists of a parasitic capacitance.

6. The clock circuit of claim 4, wherein the programmable resistor comprises a set of transistors in parallel, wherein a programmable value determines a number of the transistors used by the programmable resistor for delay purposes.

7. The clock circuit of claim 1, wherein the memory comprises one of pseudo static random access memory (PSRAM), burst memory, NOR FLASH memory, synchronous dynamic random access memory (SDRAM) and single date rate SDRAM (SDR-SDRAM).

8. A system comprising:

a memory; and a memory controller to control access to the memory, wherein the memory controller comprises a clock circuit including a driver in series with a resistor element that generates an input clock signal for input to the memory, the driver selectively separately couplable to a first processor clock and a second processor clock, and a resistor-capacitor (RC) filter in series with a receiver that generates a feedback clock signal for data output from the memory, wherein an input to the RC filter is tapped between the driver and the resistor element and the RC filter adjustable to the first processor clock to generate the feedback clock signal of a memory read operation of the first processor and to the second processor clock to generate the feedback clock signal of a memory read operation of the second processor.

9. The system of claim 8, wherein a single pin connects the clock circuit to the memory, the pin comprising output of the resistor element.

10. The system of claim 8, wherein the first and second processors couple to the memory controller via a system bus, wherein the first and second processors have access to the memory.

11. The system of claim 10, wherein one of the first and second processor clocks from a given one of the first and second processors defines an input to the driver.

12. The system of claim 8, wherein the resistor element comprises an on-die termination (ODT) resistor.

13. The system of claim 8, wherein the RC filter comprises a programmable RC filter.

14. The system of claim 13, wherein the programmable RC filter comprises a programmable resistor in parallel with a capacitor.

15. The system of claim 14, wherein the capacitor consists of a parasitic capacitance.

16. The system of claim 14, wherein the programmable resistor comprises a set of transistors in parallel, wherein a programmable value determines a number of the transistors used by the programmable resistor for delay purposes.

17. The system of claim 8, wherein the memory comprises a memory that does not generate a strobe.

18. The system of claim 17, wherein the memory comprises one of pseudo static random access memory (PSRAM), burst memory, NOR FLASH memory, synchronous dynamic random access memory (SDRAM) and single date rate SDRAM (SDR-SDRAM).

19. A method comprising:

generating an input clock signal for input to a memory by passing a processor clock signal from a processor through a driver and a resistor element of a clock signal circuit;

selectively separately coupling the driver to a first processor clock and a second processor clock; and generating a feedback clock signal for data output from the memory by passing an input through a resistor-capacitor (RC) filter and a receiver of the clock signal circuit, wherein the input to the RC filter is tapped between the driver and the resistor element of the clock signal circuit and the RC filter adjustable to the first processor clock to generate the feedback clock signal of a memory read operation of the first processor and to the second processor clock to generate the feedback clock signal of a memory read operation of the second processor.

20. The method of claim 19, wherein a single pin connects the clock circuit to the memory, the pin comprising output of the resistor element.

21. The method of claim 19, wherein the first and second processors couple to the memory controller via a system bus, wherein the first and second processors have access to the memory.

22. The method of claim 21, wherein one of the first and second processor clocks from a given one of the first and second processors defines an input to the driver.

23. The method of claim 19, wherein the resistor element comprises an on-die termination (ODT) resistor.

24. The method of claim 19, wherein the RC filter comprises a programmable RC filter.

25. The method of claim 24, wherein the programmable RC filter comprises a programmable resistor in parallel with a capacitor.

26. The method of claim 25, wherein the capacitor consists of a parasitic capacitance.

27. The method of claim 25, wherein the programmable resistor comprises a set of transistors in parallel, wherein a programmable value determines a number of the transistors used by the programmable resistor for delay purposes.

28. The method of claim 19, wherein the memory comprises a memory that does not generate a strobe.

29. The method of claim 28, wherein the memory comprises one of pseudo static random access memory (PSRAM), burst memory, NOR FLASH memory, synchronous dynamic random access memory (SDRAM) and single date rate SDRAM (SDR-SDRAM).

30. An apparatus comprising:

means for generating an input clock signal for input to a memory by passing a processor clock signal from a processor through a driver and a resistor element of a clock signal circuit;

means for selectively separately coupling the driver to a first processor clock and a second processor clock; and means for generating a feedback clock signal for data output from the memory by passing an input through a resistor-capacitor (RC) filter and a receiver of the clock signal circuit, wherein the input to the RC filter is tapped between the driver and the resistor element of the clock signal circuit and the RC filter adjustable to the first processor clock to generate the feedback clock signal of a memory read operation of the first processor and to the second processor clock to generate the feedback clock signal of a memory read operation of the second processor.

31. The apparatus of claim 30, further comprising a means for coupling the first and second processors to the memory controller via a system bus, wherein the first and second processors have access to the memory.

32. The apparatus of claim 30, wherein the resistor element comprises an on-die termination (ODT) resistor.

33. The apparatus of claim 30, wherein the RC filter comprises a programmable RC filter.

34. The apparatus of claim 30, wherein the memory comprises a memory that does not generate a strobe.

* * * * *

UNITED STATES PATENT AND TRADEMARK OFFICE

CERTIFICATE OF CORRECTION

PATENT NO. : 7,656,743 B2
APPLICATION NO. : 11/364296
DATED : February 2, 2010
INVENTOR(S) : Srinivas et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 96 days.

Signed and Sealed this

Twenty-eighth Day of December, 2010

David J. Kappos

*Director of the United States Patent and Trademark Office*